United States Patent
Perner et al.

(10) Patent No.: US 7,239,568 B2
(45) Date of Patent: Jul. 3, 2007

(54) CURRENT THRESHOLD DETECTOR

(75) Inventors: Frederick A. Perner, Palo Alto, CA (US); Manoj K. Bhattacharyya, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 309 days.

(21) Appl. No.: 10/767,428

(22) Filed: Jan. 29, 2004

(65) Prior Publication Data

US 2005/0169059 A1   Aug. 4, 2005

(51) Int. Cl.
G11C 7/02 (2006.01)
G11C 11/00 (2006.01)

(52) U.S. Cl. ............... 365/209; 365/158; 365/171

(58) Field of Classification Search ............... 365/209
See application file for complete search history.

(56) References Cited

U.S. PATENT DOCUMENTS

| | | | |
|---|---|---|---|
| 6,081,445 A * | 6/2000 | Shi et al. ............... 365/158 |
| 6,404,671 B1 | 6/2002 | Reohr et al. |
| 6,606,262 B2 * | 8/2003 | Perner ............... 365/158 |
| 6,751,147 B1 * | 6/2004 | Smith et al. ............ 365/225.5 |
| 6,791,873 B1 * | 9/2004 | Perner ............... 365/158 |
| 2001/0024381 A1 | 9/2001 | Fuchigami et al. |
| 2003/0081453 A1 * | 5/2003 | Hidaka ............... 365/173 |
| 2003/0128578 A1 | 7/2003 | Perner et al. |

* cited by examiner

*Primary Examiner*—Son L. Mai

(57) ABSTRACT

A magnetic memory cell write current threshold detector. The magnetic memory cell write current threshold detector includes a first MRAM test cell receiving a write current and sensing when the write current exceeds a first threshold, and a second MRAM test cell receiving the write current and sensing when the write current exceeds a second threshold.

11 Claims, 16 Drawing Sheets

CURRENT THRESHOLD DETECTOR

CROSS-REFERENCE TO RELATED APPLICATION

This patent application is related to U.S. patent application to Fred Perner, entitled "An Apparatus and Method for Generating a Write Current for a Magnetic Memory Cell", having USPTO Ser. No. 10/658,442, filed on Sep. 8, 2003.

FIELD OF THE INVENTION

The invention relates generally to electronics. More particularly, the invention relates to a current threshold detector.

BACKGROUND OF THE INVENTION

Non-volatile memory is memory that retains its content (data) even when power connected to the memory is turned off. Magnetic random access memory (MRAM) is a type of non-volatile memory. A logical state, or bit, is stored in MRAM by setting magnetic field orientations of MRAM cells within the MRAM. The magnetic field orientations remain even when power to the MRAM cells is turned off.

FIG. 1 shows an MRAM cell 100. The MRAM memory cell 100 includes a soft magnetic region 120, a dielectric region 130 and a hard magnetic region 110. The orientation of magnetization within the soft magnetic region 120 is non-fixed, and can assume two stable orientations as shown by the arrow M1. These two orientations, are either parallel or anti-parallel to the magnetic orientation of the hard magnetic region 110, and determine the logical state of the MRAM memory cell 100. The hard magnetic region 110 (also referred to as a pinned magnetic region) has a fixed magnetic orientation as depicted by the arrow M2. The dielectric region 130 generally provides electrical insulation between the soft magnetic region 120 and the hard magnetic region 110.

The MRAM memory cell is generally located proximate to a crossing point of a word line (WL) and a bit line (BL). The magnetic orientations of the MRAM memory cells are set (written to) by controlling the directions of electrical currents flowing through the word lines and the bit lines, and therefore, by the corresponding magnetic fields induced by the electrical currents. Additionally, the write lines can also be used to read the logic value stored in the memory cells.

The MRAM memory cells are read by sensing a resistance across the MRAM memory cells. The resistance is sensed through the word lines and the bit lines. Generally, the resistance (and therefore, the logical state) of a magnetic memory cell depends on the relative orientations of magnetization in the data layer and the reference layer. For example, the magnetic memory cell is in a state of low resistance if the overall orientation of the magnetization in its data storage layer is parallel to the pinned orientation of magnetization of the reference layer. Conversely, the tunneling junction memory cell is in a high resistance if the overall orientation of magnetization in its data storage layer is anti-parallel to the pinned orientation of magnetization of the reference layer. The magnitude of the switching field to switch the state of the magnetic memory cells can change over time, further complicating processes for switching the states of the magnetic memory cells.

FIG. 2 shows an array 210 of MRAM memory cells. Bit line and word line selections are made by a row decoder 220 and a column decoder 230, which select a memory cell by conducting current through a selected bit line (BL) and a selected word line (WL). For example, a memory cell 250 is selected by conducting current though a selected bit line 260 and a selected word line 270. The induced magnetic fields should be great enough to reliably set the orientation of magnetization of the selected memory cells of the array of MRAM memory cells 210. The logical states of the memory cells are sensed through corresponding word lines and bit lines by a sense amplifier 240.

The array 210 of MRAM memory cells can suffer from half-select errors when writing to the memory cells. Writing to the memory cells includes selecting a particular bit line (BL), and selecting a particular word line (WL). A half-select error occurs when a memory cell associated with a selected bit line and a non-selected word line changes states, or when a memory cell associated with a non-selected bit line and a selected word line changes states. Clearly, half-select errors degrade the performance of MRAM memory. The write current to the memory cells should be controlled from being so large that excessive half-select errors occur.

It is desirable to minimize half-select errors of MRAM memory cells within arrays of MRAM memory cells over time. Additionally, it is desirable that write operations to the MRAM memory cells be consistent and reliable.

SUMMARY OF THE INVENTION

A first embodiment of the invention includes a current threshold range detector. The current threshold range detector includes a first test memory cell for sensing a first current threshold, and a second test memory cell for sensing a second current threshold.

A second embodiment of the invention includes a magnetic memory cell write current threshold detector. The magnetic memory cell write current threshold detector includes a first MRAM test cell receiving a write current and sensing when the write current exceeds a first threshold, and a second MRAM test cell receiving the write current and sensing when the write current exceeds a second threshold.

Other aspects and advantages of the present invention will become apparent from the following detailed description, taken in conjunction with the accompanying drawings, illustrating by way of example the principles of the invention.

DETAILED DESCRIPTION

Figure 1:
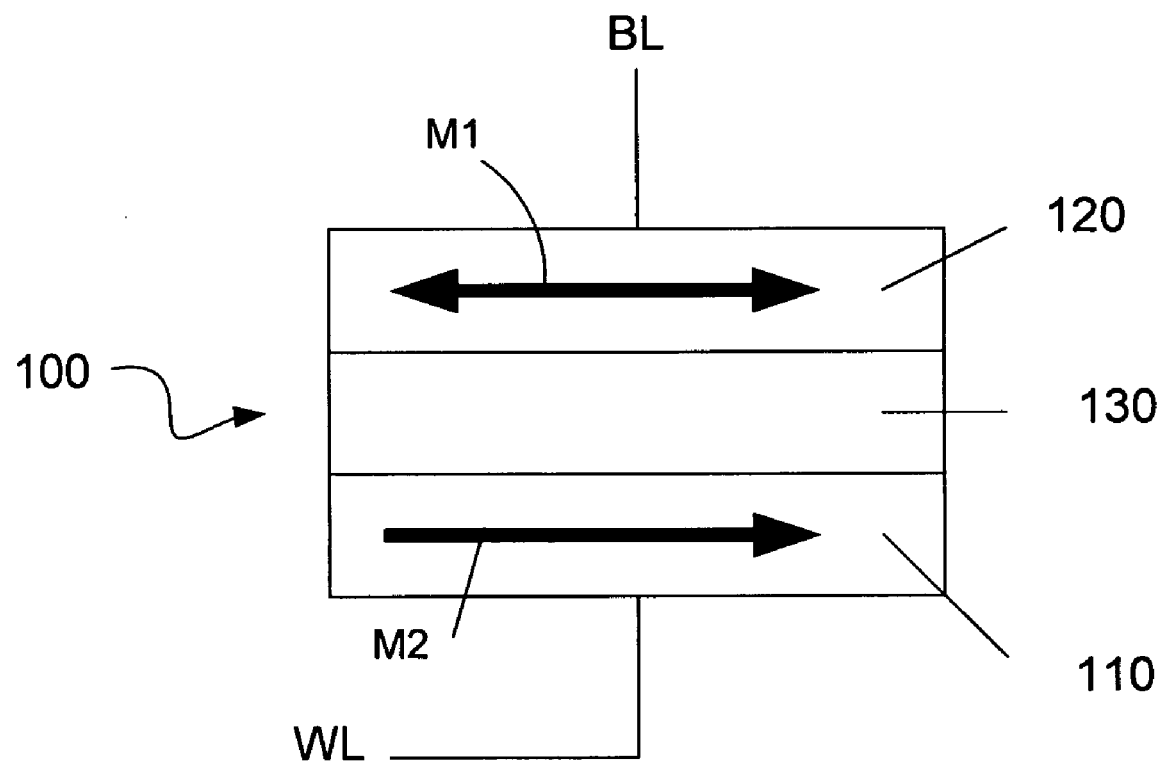
FIG. 1 shows a prior art MRAM memory cell.
Figure 2:
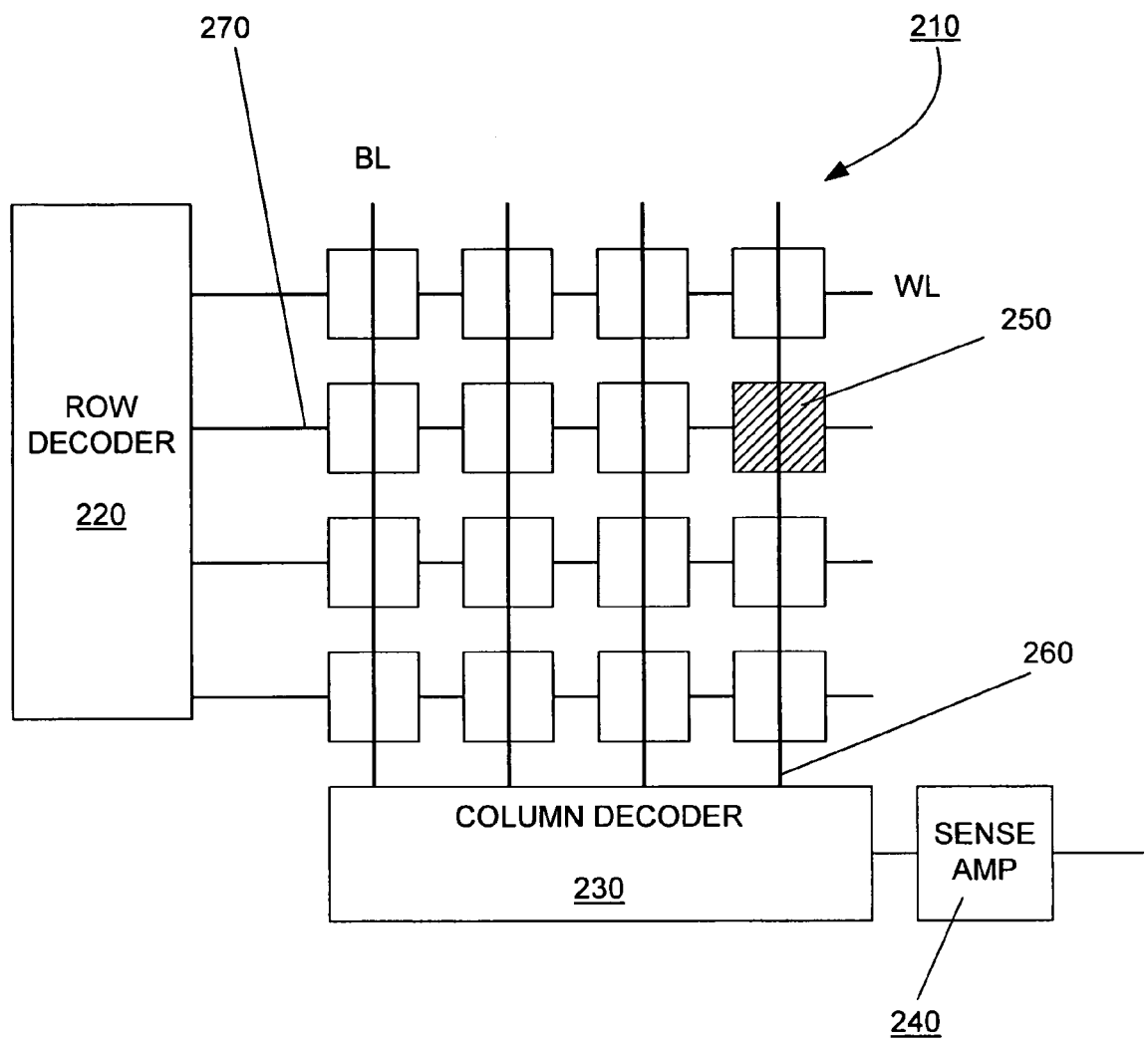
FIG. 2 shows a prior art array of MRAM memory cells.
Figure 3:
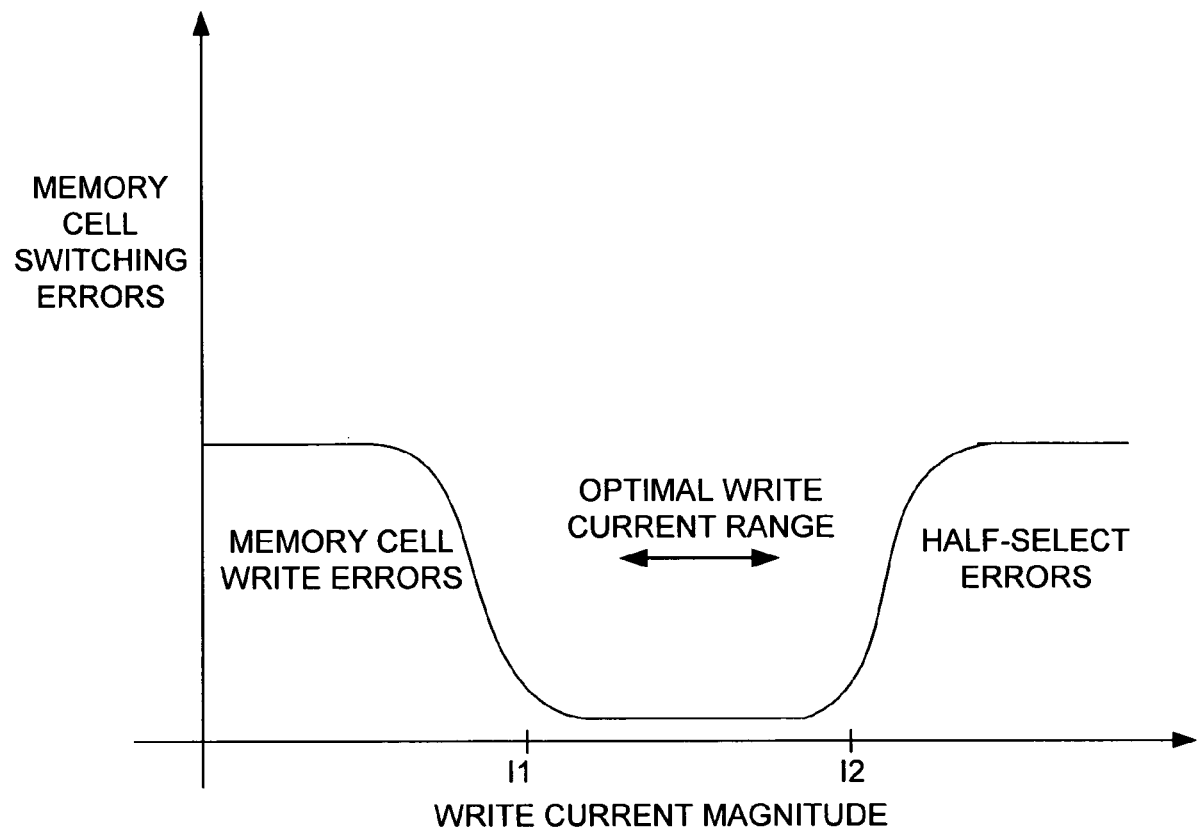
FIG. 3 is a plot showing a relationship between magnetic memory write current and possible memory write errors.

FIG. 3 is a plot showing a relationship between magnetic memory write current and possible magnetic memory write errors. FIG. 3 also shows that when the write current is below a first threshold current (I1), then memory cell write errors occur. If the write current is below the first threshold (I1), the magnetic field created by the write current is too small to consistently write to the memory cells.

FIG. 3 shows that if the write current to a magnetic memory cell within an array of magnetic memory cells is greater than a second threshold current (I2), then magnetic memory cells within the array are likely to suffer from half select errors. Half-select errors occur when a memory cell associated with a selected bit line and a non-selected word line changes states, or when a memory cell associated with a non-selected bit line and a selected word line changes states. Generally, half-select errors occur when the magnitude of the write current is too large, and more memory cells than the desired memory cell are magnetically induced to change states.

As suggested by FIG. 3, there is generally an optimal range of write current for magnetic memory cells within an array of magnetic memory cells. The optimal range is great enough to reliably write to a magnetic memory cell, but low enough to minimize half-select errors within the array of magnetic memory cells.

Figure 4:
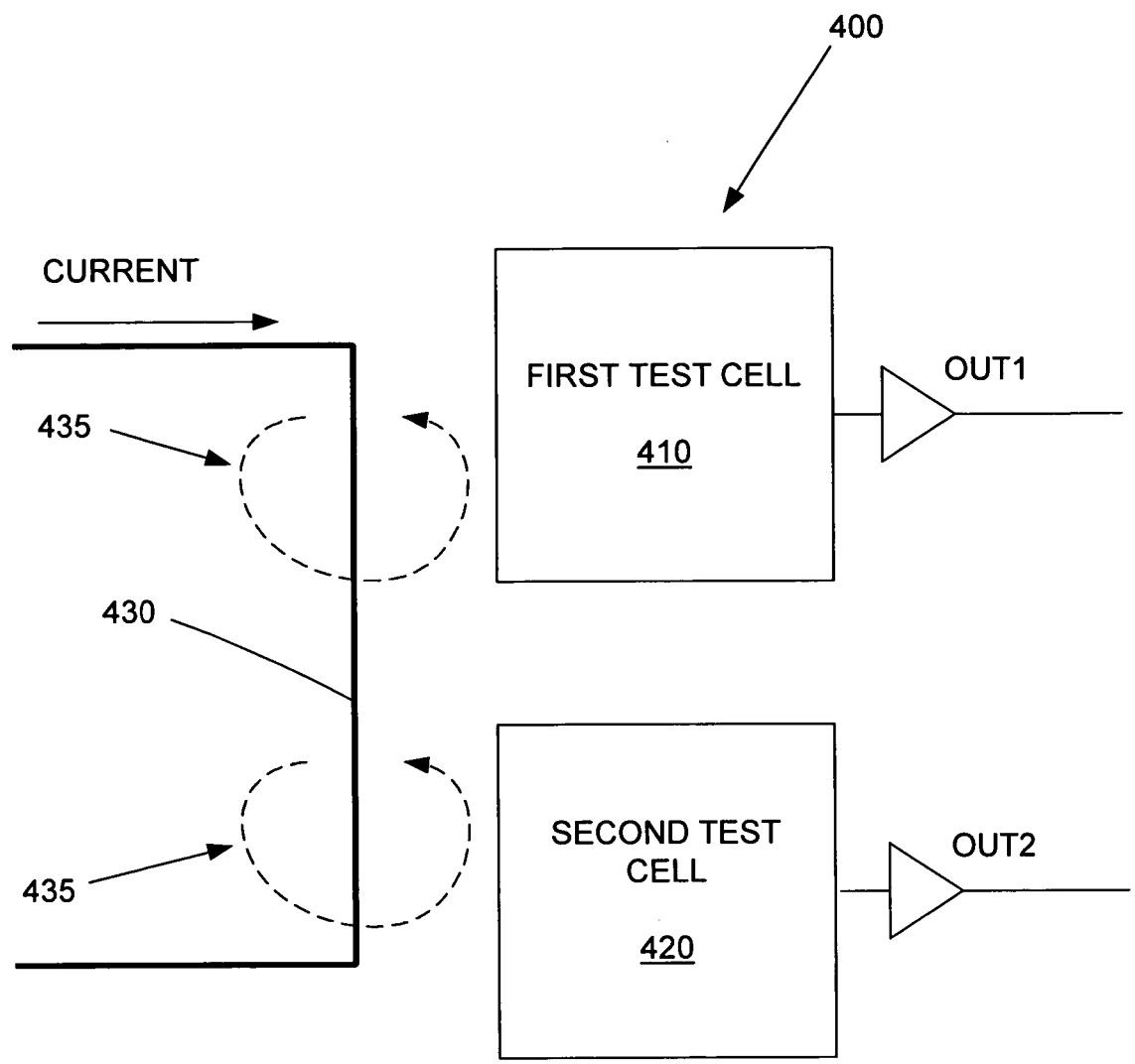
FIG. 4 shows a current threshold detector according to one embodiment of the invention.

FIG. 4 shows one example of a current threshold range detector 400. The current threshold range detector 400 includes a first test memory cell 410 for sensing a first current threshold, and a second test memory cell 420 for sensing a second current threshold. The current to be threshold detected is conducted through a write conductor 430 located proximate to the first test memory cell 410 and the second test memory cell 420. A magnetic field 435 induced by the conducting current causes the first test memory cell 410 to change its magnetic orientation if the conducting current exceeds the first current threshold, and the magnetic field 435 induced by the conducting current causes the second test memory cell 420 to change its magnetic orientation if the conducting current exceeds a second current threshold.

One example of an implementation of the first test memory cell 410 includes a first MRAM cell that is configured to switch magnetic orientations when a magnetic field created by a current having a magnetic field equal to the first current threshold is applied to the first MRAM cell. One example of an implementation of the second test memory cell 420 includes a second MRAM cell that is configured to switch magnetic orientations when a magnetic field created by a current having a magnetic equal to the second current threshold is applied to the second MRAM cell. Outputs Out1, Out2 provide outputs reflecting the magnetic orientation of the first test memory cell 410 and the second test memory cell 420.

Operationally, the first MRAM cell is configured to change magnetic orientations when a current having a magnitude of at least the first current threshold is applied, and the second MRAM cell is configured to change magnetic orientations when a current having a magnitude of at least the second current threshold is applied. As previously described, the resistances of the first and second MRAM cells change when the magnetic orientations of the first and second MRAM cells change. Therefore, it is possible to sense when the applied current has exceeded the first and second thresholds. The first and second thresholds can be selected by varying at least one of several physical parameters of the first and second MRAM cells, such as the shape, dimensions, thickness and material properties.

Figure 5:
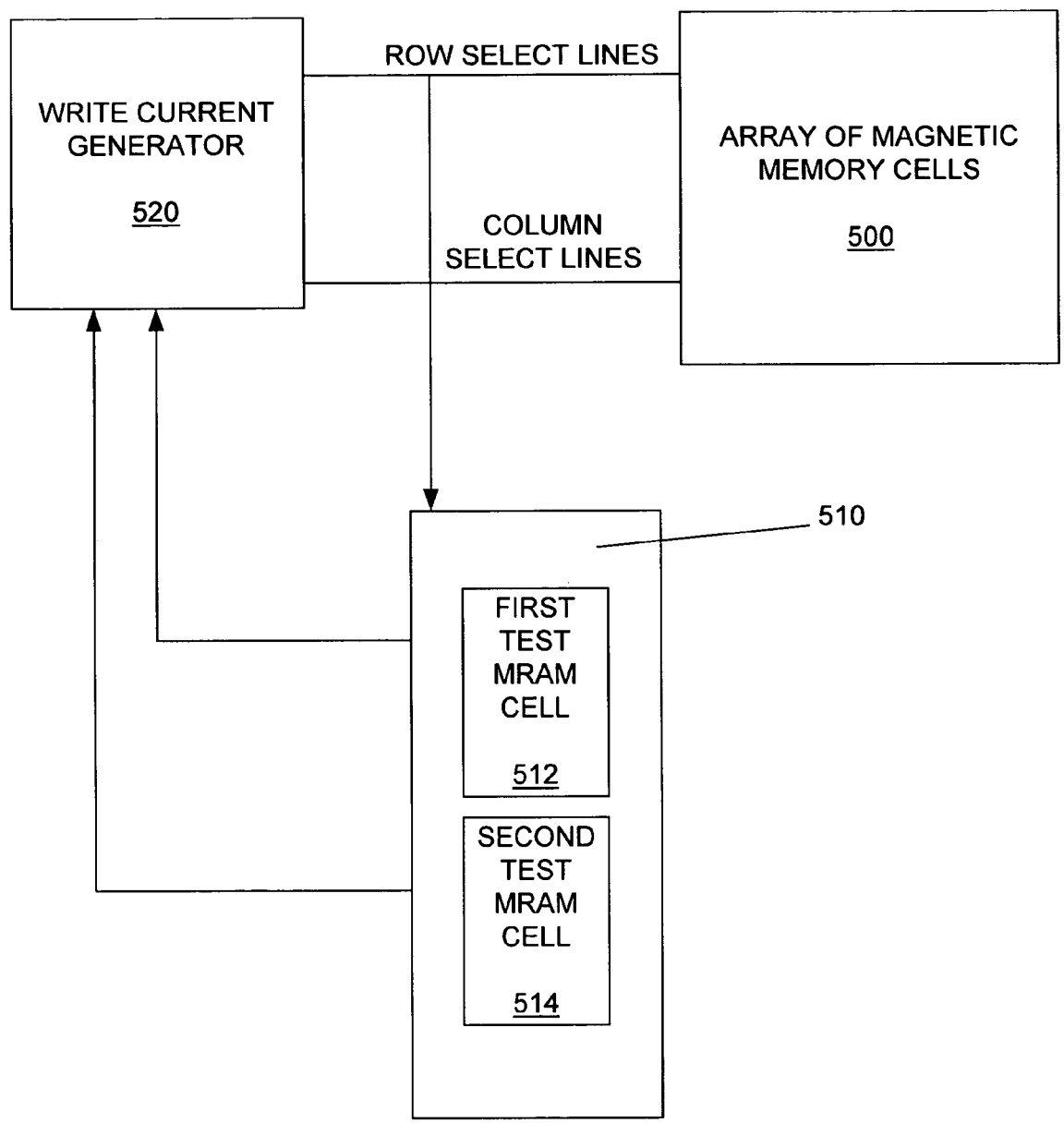
FIG. 5 shows an example of magnetic memory that includes a magnetic memory cell write current threshold detector, according to an embodiment of the invention.

FIG. 5 shows one example of an array of magnetic memory cells 500 that includes a current threshold detector 510. A write current generator 520 generates a write current for writing to selected memory cells within the array of magnetic memory cells. The current threshold detector 510 indicates when the write current is great enough to reliably write to the memory cells within the array of magnetic memory cells 500, but not so great that half select errors occur.

One example of the current threshold detector 510 includes a first test magnetic memory cell 512 for sensing when a magnitude of the write current is large enough to reliably write to the magnetic memory cells, and a second test magnetic memory cell 514 for sensing when the magnitude of the write current is so large that half select errors occur when writing to the magnetic memory cells. The range of write current to reliably write to the magnetic memory cells can be predetermined through experimentation or characterization.

The first and second test magnetic memory cells 512, 514 can be physically larger than the magnetic memory cells of the array of magnetic memory cells 500. This can be advantageous because the larger the physical size of the memory cells, the easier it is to accurately select the threshold current to switch the orientation of the magnetic memory cells. Larger magnetic memory cells tend to need smaller magnitudes of current to change magnetic orientations. A scaling factor can be used to provide an accurate one to one representation between the switching of the test magnetic memory cells and the magnetic memory cells of the array of magnetic memory cells 500.

Test magnetic memory cells that are larger than the memory cells of an associated array of memory cells are easier to manufacture and are less likely to suffer from super paramagnetic effects. Super paramagnetic effects can result in the direction of magnetization of smaller sized bits spontaneously reversing even without the application of a write current. The memory cells of an array are generally formed to include features that are as small as lithography formation processes allow, making the shape of the memory cells hard to control. It is much easier to control the shape of substantially larger test magnetic memory cells.

Figure 6:
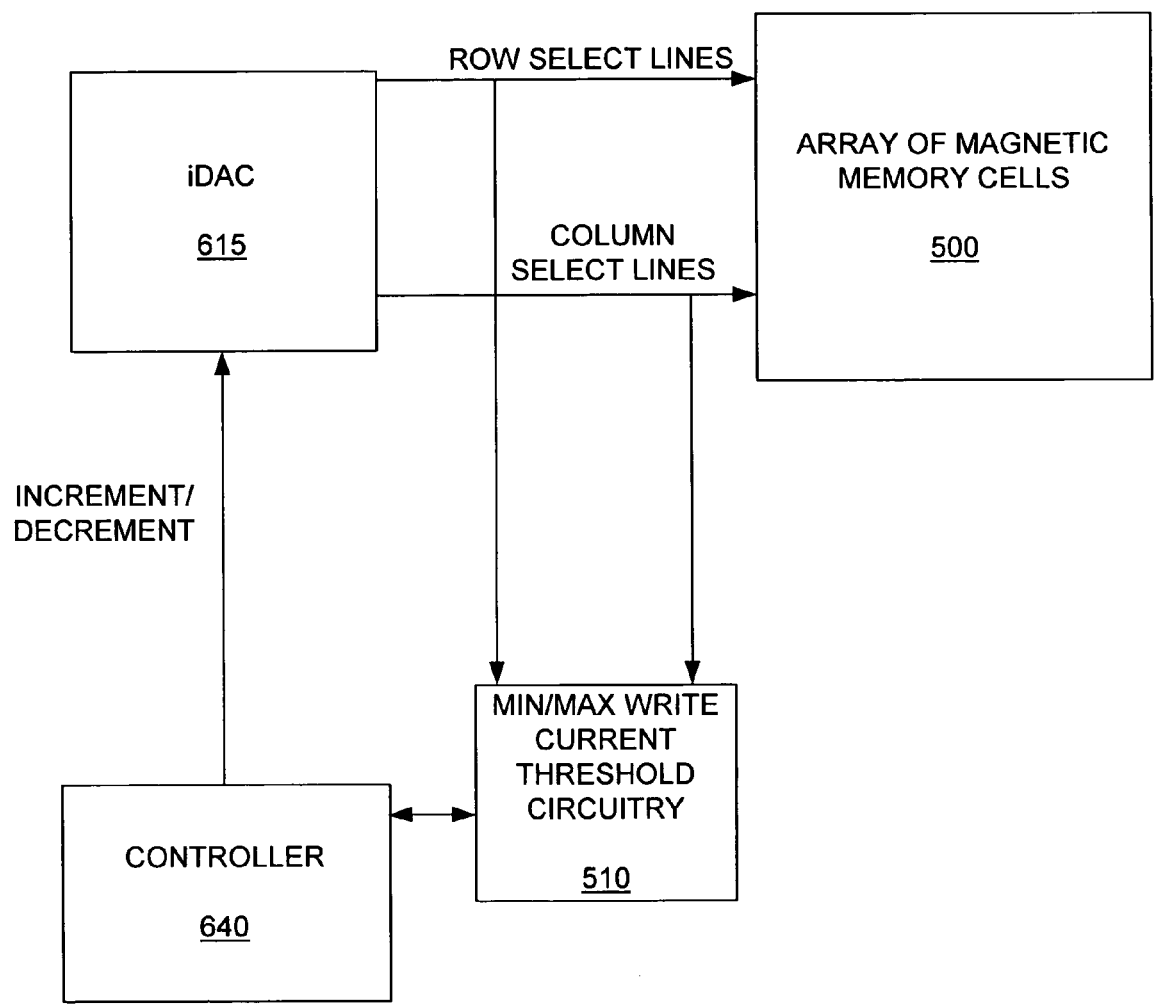
FIG. 6 shows another example of magnetic memory that includes a magnetic memory cell write current threshold detector, according to an embodiment of the invention.

FIG. 6 shows memory array write mechanism that implements additional principles of the invention. This implementation includes an current digital to analog converter (iDAC)

615 and a controller 640. The current threshold detector 510 provides feedback to the controller 640 when the first and second current thresholds have been exceeded. The controller 640 increases or decreases the write current by incrementing or decrementing a digital value provided to the IDAC 615.

Figure 7:
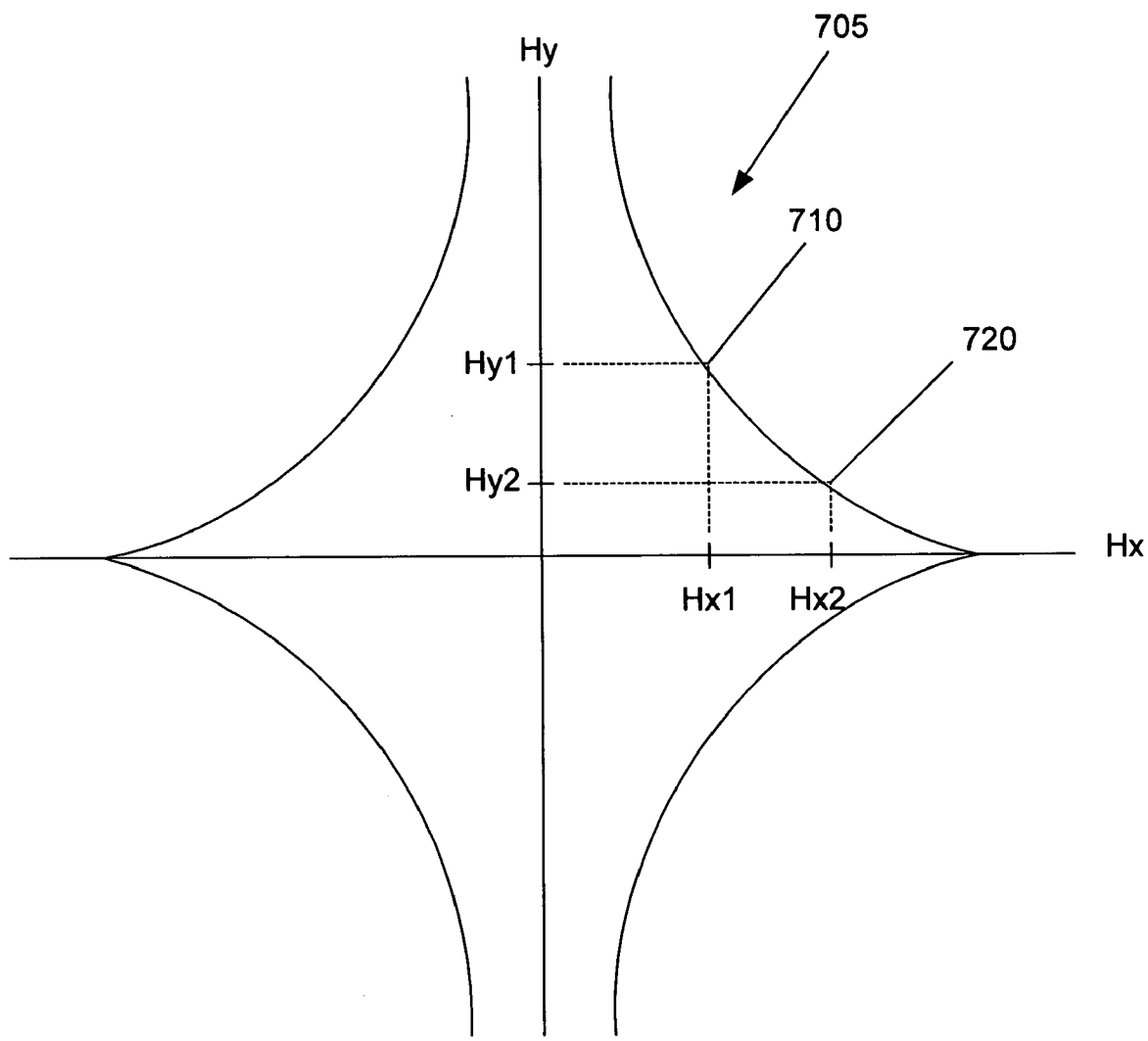
FIG. 7 is a plot showing an intensity of externally applied magnetic fields causing an MRAM memory cell to change states.

FIG. 7 is a plot showing an intensity of externally applied magnetic fields causing an MRAM memory cell to change state. A first axis of the plot is an Hx axis and a second axis of the plot is an Hy axis. Generally, an X-axis of the described magnetic tunnel junction memory cells corresponds with the longest cross-sectional dimension of the magnetic tunnel junction memory cells, and therefore, the most stable magnetic orientation of the magnetic tunnel junction memory cells. As a result, two stable magnetic orientations of the magnetic tunnel junction cells are parallel and anti-parallel to the X-axis of the memory cells.

FIG. 7 shows the magnetic field intensity needed to "flip" or change the magnetic orientation of the soft magnetic region of the magnetic memory cell. For example, a first quadrant 705 of the plot of FIG. 7 shows the Hx magnetic field causing the MRAM memory cell to change magnetic states for various values of applied Hy magnetic field. A first switch point 710 suggests a first level $Hx_1$ of Hx magnetic field intensity to change the magnetic state of the memory cell for a first level $Hy_1$ of Hy magnetic field intensity. A second switch point 720 suggests a second level $Hx_2$ of Hx magnetic field intensity to change the magnetic state of the memory cell for a second level $Hy_2$ of Hy magnetic field intensity. The $Hx_2$ magnetic field intensity of the second switch point 720 is greater than the $Hx_1$ magnetic field intensity of the first switch point 710.

Information regarding the Hy, Hx switching characteristics of the magnetic memory cells can be used to select Hy, Hx magnetic fields that minimize half-select errors. More specifically, increasing the Hy magnetic field of a selected memory cell decreases the Hx magnetic field needed to write to the magnetic memory cell. Therefore, other non-selected magnetic memory cells within an array of magnetic memory cells include an Hy magnetic field that is negligible, and therefore, need a greater Hx magnetic field causing a change in state. Selected memory cells should include a write current that includes an Hy magnetic field that is as great (the maximum level of Hy magnetic field is generally limited by power dissipation) as is reasonably possible to minimize half-select errors.

The Hy, Hx switching characteristics of the magnetic memory cells can also be used to minimize write errors. More specifically, for a selected Hy, an Hx magnetic field is selected to ensure proper writing to the selected memory cell. That is, an Hx magnetic field is selected that is great enough to provide reliable writing to the selected magnetic memory cell. However, the Hx magnetic field cannot be so great that half-select errors occur.

Figure 8:
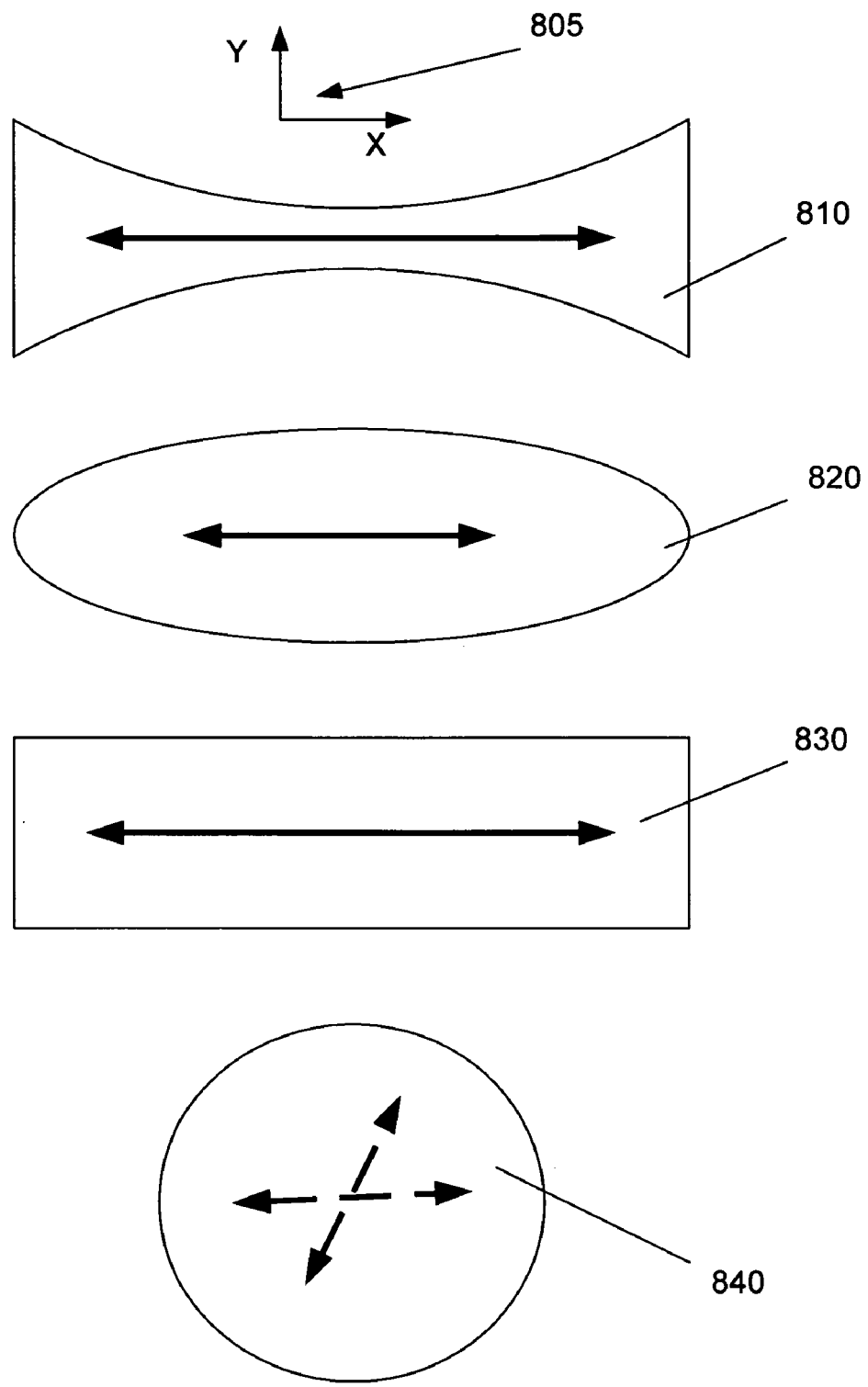
FIG. 8 shows possible shapes of memory cells having various levels of magnetic stability.

FIG. 8 shows memory cells having varying shapes, resulting in varying sensitivities of the magnetic orientation of the memory cells to write currents. The variations of the shapes of the memory cells can be used for accurate selections of the threshold currents required to switch the magnetic orientations of the memory cells. An orientation indicator 805 depicts relative X-axis and Y-axis orientations of the various memory cell shapes. Generally, the X-axis corresponds to the longest cross-sectional dimension of the memory cells, and therefore, the most stable magnetic orientation of the memory cells.

A first memory cell shape 810 includes a majority amount of the memory cell existing at each end of the memory cell 810. The X-axis dimension of the memory cell is substantially greater than the Y-axis dimension of the memory cell. Of the memory cell shapes shown in FIG. 8, the memory cell shape 810 is typically the most stable.

A second memory cell shape 820 includes an elliptical shape. As with the first memory cell shape 810, the X-axis dimension of this memory cell is substantially greater than the Y-axis dimension. The second memory cell shape 820 includes less memory material at each end than the first memory cell shape 810. The second memory cell shape 820, is generally considered to be very stable, but less stable than the first memory cell shape 810.

A third memory cell shape 830 includes a rectangular shape. As with the first memory cell shape 810, the X-axis dimension of this memory cell is substantially greater than the Y-axis dimension. The third memory cell shape 830 includes less memory material at each end than the first memory cell shape 810. The third memory cell shape 830, is generally considered to be very stable, but less stable than the first memory cell shape 810, or the second memory cell shape 820.

A fourth memory cell shape 840 includes a circular shape. Unlike with the other memory cell shapes 810, 820, 830, the Y-axis dimension of this memory cell is substantially the same as the X-axis dimension. The magnetic orientation of the fourth memory cell shape is very unstable. This memory cell shape is undesirable because the memory cell will change magnetic orientations very easily.

Figure 9:
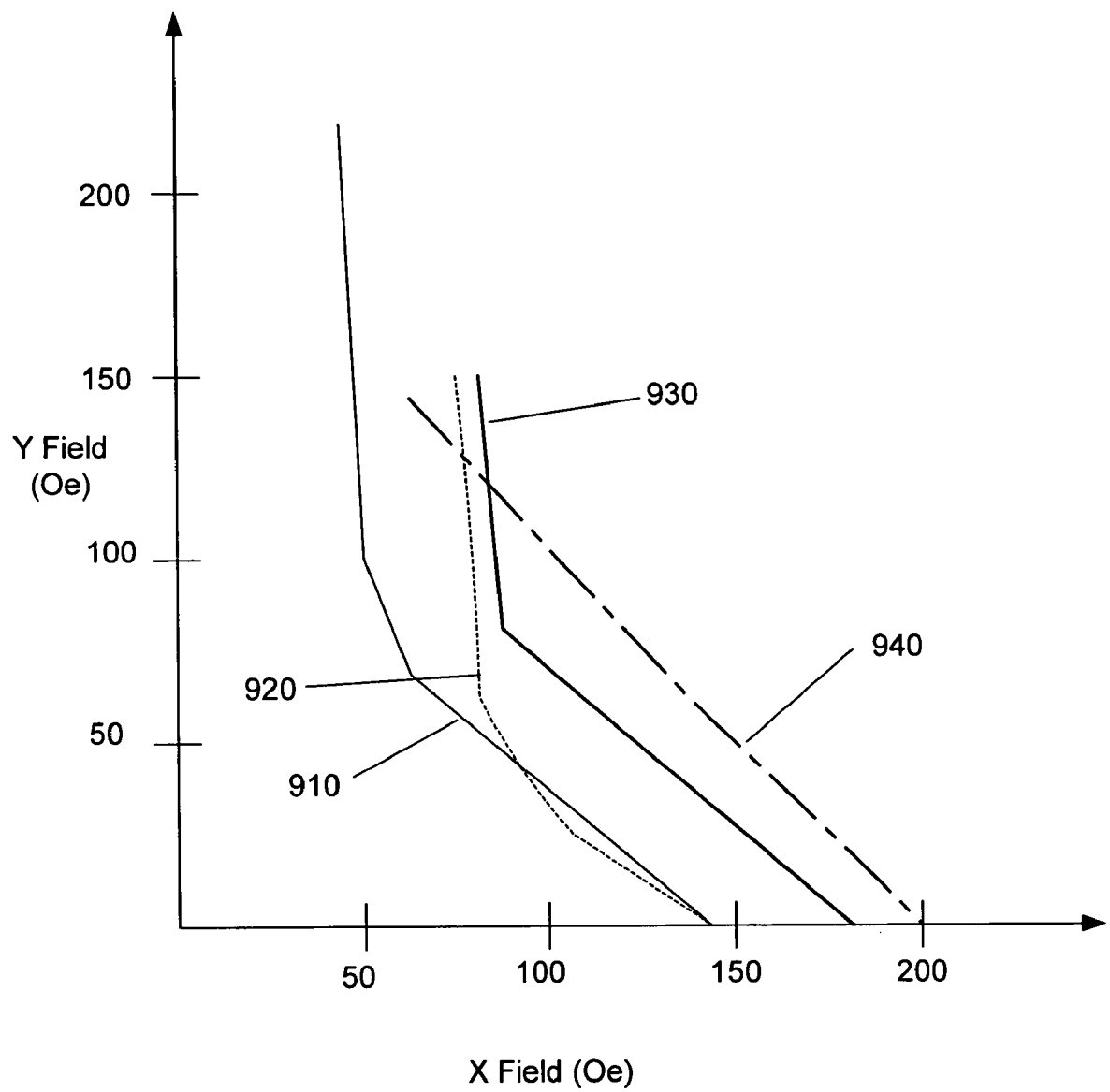
FIG. 9 is a plot showing the relative intensity of externally applied magnetic fields causing the MRAM memory cells having the shapes of FIG. 8 to change states.

FIG. 9 is a plot showing the relative intensity of externally applied magnetic fields causing the MRAM memory cells to change shapes, for various memory cell shapes sharing a common physical structure.

A first curve 910 represents the magnetic switching curve for an ellipse shaped memory cell having a Y-axis dimension of 0.18 um and an X-axis dimension of 0.36 um. A second curve 920 represents the magnetic switching curve for an ellipse shaped memory cell having a Y-axis dimension of 0.18 um and an X-axis dimension of 0.27 um. A third curve 930 represents the magnetic switching curve for a rectangular shaped memory cell having a Y-axis dimension of 0.18 um and an X-axis dimension of 0.36 um. A fourth curve 940 represents the magnetic switching curve for a rectangular shaped memory cell having a Y-axis dimension of 0.18 um and an X-axis dimension of 0.27 um.

The magnetic field intensity causing the magnetic memory cell to switch states can be determined by computer aided simulation, and the Landau-Lifschitz equation. More precisely, solving:

$$\frac{d\overline{M}(r)}{dt} = -\gamma \overline{M}(r) X \overline{Heff} - \frac{\lambda}{|M|} \overline{M} X (\overline{M}(r) X \overline{Heff}(r))$$

Where M is a magnetization vector, Heff is an effective magnetic field which includes anisotropy terms and noise terms, t is time, r represents three dimensional spatial coordinates, λ is a damping parameter and γ is a gyromagnetic constant.

The responses of the magnetic memory cell to different write currents and operating conditions are obtained by computer simulation in which the Landau-Lifschitz equation is solved with discretized 3-dimensional geometry, using iterative methods. The exact geometry of the sense layer, the reference layer, the cladding and the conductor, as well as material properties (for example, crystalline anisotropy, saturation magnetization and exchange constant) and thermal noise are included.

The simulation conditions of FIG. 9 included the sense layer being formed from NiFe, the conductor being formed from copper, and the cladding being formed from NiFe. The spacing between the memory cells and the conductor was assumed to be 0.1 um. The reference layer was assumed to be an IrMn pinned NiFe layer.

These plots clearly show that increasing the X-axis dimension of the memory cell shape increases the magnetic stability of the memory cells. Additionally, these plots show that with lower levels of Hx, the elliptical shaped memory cell having the X-axis dimension of 0.36 um is generally the most stable shape.

Computer simulation can provide an optimal memory cell shape by determining the memory cell shape that provides the maximal stability, while still ensuring the memory cell can change states when the maximal available magnetic write field intensity to applied to the memory cell.

Figure 10:
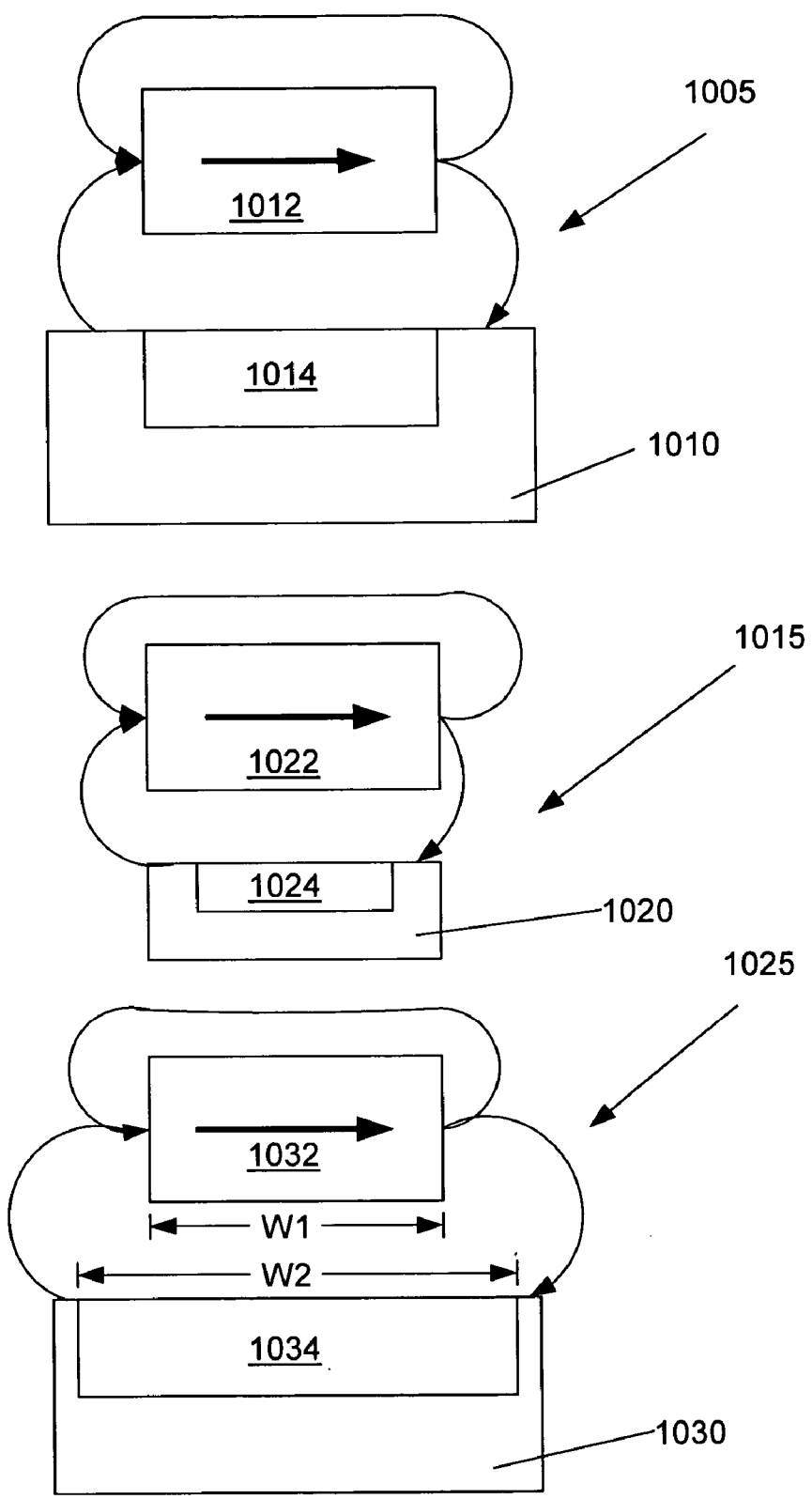
FIG. 10 shows memory cells located proximate to various shapes of u-shaped conductive lines.

FIG. 10 shows memory cells 1012, 1022, 1032 located proximate to various shapes of conductive lines 1014, 1024, 1034. The conductive lines 1014, 1024, 1034 of FIG. 10 each include a u-shaped cladding 1010, 1020, 1030 that interact with the memory cells 1012, 1022, 1032. The various shapes of the conductive lines 1014, 1024, 1034 provide different degrees of overlap of the memory cells 1012, 1022, 1032 with the u-shaped openings of the cells 1012, 1022, 1032.

The u-shaped designation is used loosely. That is, the conductive lines that include cladding on all sides except a side facing, or closest to the memory cells 1012, 1022, 1032. The conductive lines 1014, 1024, 1034 are actually rectangular shaped.

The different degrees of overlap provide varying levels of coupling between the memory cells 1012, 1022, 1032 and the u-shaped cladding 1010, 1020, 1030. The overlap defines how large the width W1 of the memory cell is with respect to the width W2 of the conductor line. The amount of overlap can be used to provide additional control over the stability of the memory cells 1012, 1022, 1032.

The cladding 1010, 1020, 1030 is typically a ferromagnetic material, that can be NiFe. The conductive lines 1014, 1024, 1034 can generate a write magnetic field in response to an externally supplied write current that is conducted through the conductive lines 1014, 1024, 1034. The write magnetic field is substantially contained within the ferromagnetic cladding. Essentially, the ferromagnetic cladding provides a closed magnetic path (flux closure) around the conductive lines 1014, 1024, 1034. By passing a write current of a predetermined magnitude and direction through the conductors, a resulting write magnetic field that is strong enough to establish an orientation of magnetization in a known direction in a soft ferromagnetic sense layer of the memory cell is created. The ferromagnetic cladding substantially attenuates fringe fields that can interfere with or corrupt data stored in the ferromagnetic data layers of neighboring memory cells. The ferromagnetic cladding typically includes a tailored thickness that is designed to insure that the magnetic write field is substantially contained within the cladding.

The cladding provides two functions. First, the cladding provides concentration of the magnetic write field produced by the write current conducted through the conductive lines. Therefore, the magnitude of the current to alter the magnetic orientation of the memory cells is less than it would be if the cladding was not present. Second, the cladding provides additional stability of the memory cells. That is, the presence of the cladding reduces that possibility that memory cells proximate to the cladding will change states unexpectedly.

For the embodiments of the conductive lines of FIG. 10, the shapes of the cladding 1010, 1020, 1030 can be characterized by a ratio (W2/W1) of the size of the opening of the cladding (designated as W2 in FIG. 10) to the X-axis of the memory cells (designated as W1 in FIG. 10). A first embodiment 1005 includes W2 being substantially equal to W1. A second embodiment 1015 includes W2 being less than W1. A third embodiment 1025 includes W2 being greater than W1.

Figure 11:
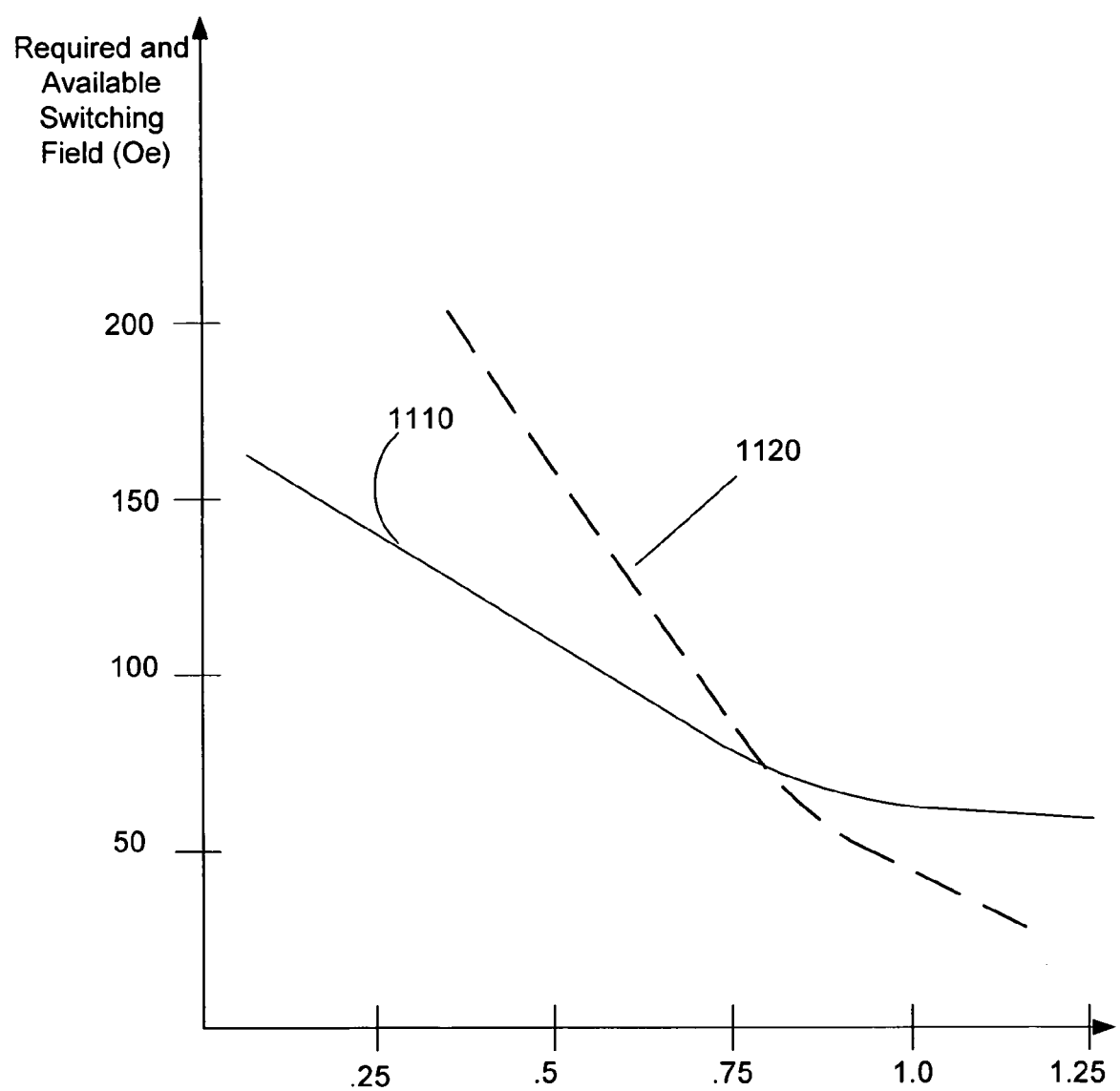
FIG. 11 is a plot showing the intensity of externally applied magnetic fields causing the MRAM memory cells located proximate to the conductive lines of FIG. 10 to change states.

FIG. 11 is a plot showing the relative intensity of externally applied magnetic fields causing the MRAM memory cells located proximate to the conductive lines and include varying degrees of overlap with the conductive lines. The plot shows the variations of the magnetic field causing the memory cell to switch states for various ratios of W2/W1.

A first curve 1110 depicts the magnetic field produced by the conductive line, and a second curve 1120 depicts the magnetic field causing the memory cell to change magnetic states. An optimal W2/W1 ratio is about 0.75 to 1.0. At this ratio, the two curves 1110, 1120 are roughly equal. However, more importantly, the magnetic field produced 1110 is greater than the magnetic field 112 field causing the memory cell to change magnetic states. The optimal ratio can change if the physical characteristics of the conductive line and the memory cell are varied.

Again, the magnetic field intensity causing the magnetic memory cell to switch states in FIG. 11 can be determined by computer aided simulation, and the above described Landau-Lifschitz equation.

It is to be understood that memory cell overlap and memory cell shape, are interdependent. For example, square memory cells with a large amount of overlap between the memory cells and write conductor cladding are very stable. The increased overlap provides effectively the same result as increasing the aspect ratio of a rectangular memory cell. Essentially, the greater surface area of the memory cell overlap, the greater the stability of the memory cell.

Figure 12:
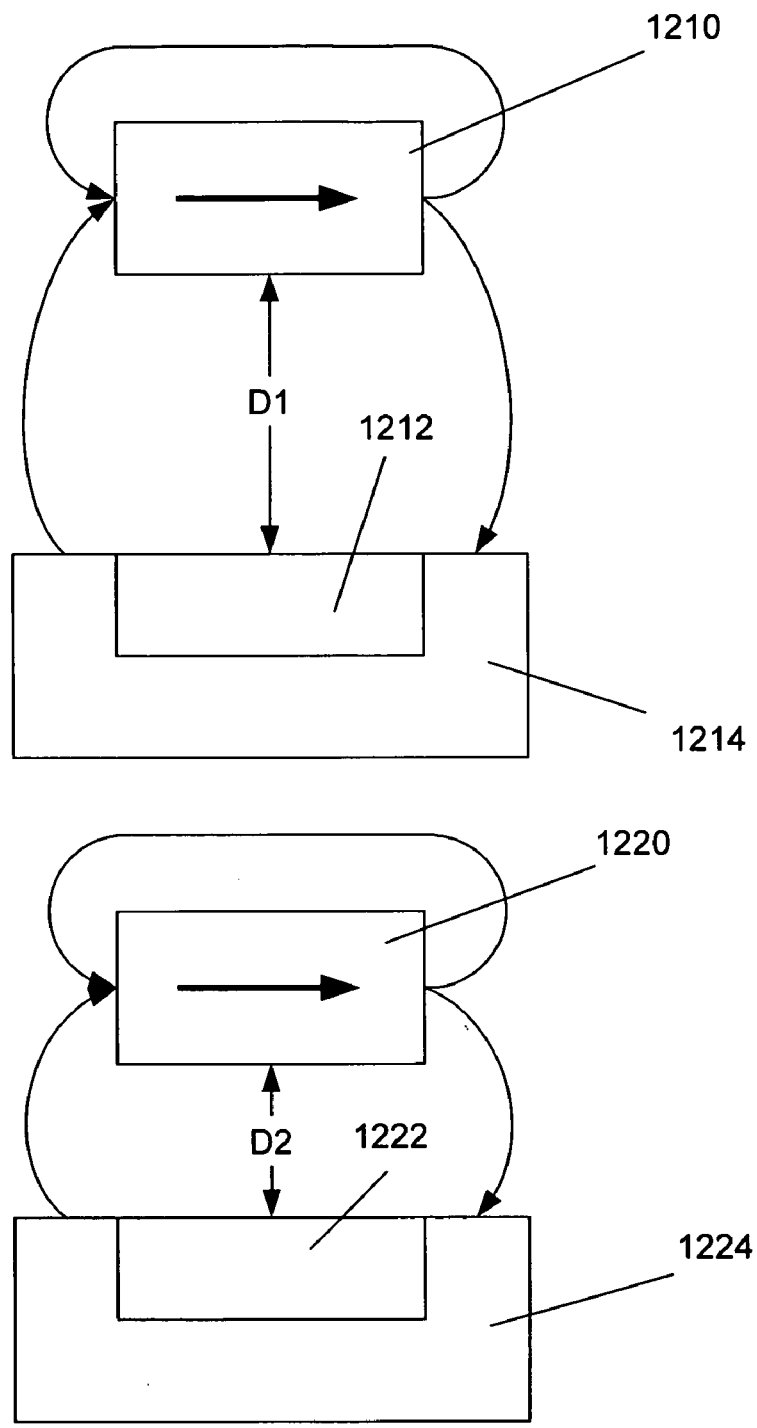
FIG. 12 shows memory cells located various distances from a u-shaped conductive line.

FIG. 12 shows memory cells located various distances from a u-shaped conductive line. A first memory cell 1210 is located a first distance D1 from a first write line 1212 that include cladding 1214. A second memory cell 1220 is located a second distance D2 from a second write line 1222 that include cladding 1224.

Generally, the closer an MRAM memory cell is to a cladded write line, the greater the coupling between the memory cell and the write line. Therefore, controlling the distance between the memory cell and the cladded write line can also be used to control the stability of the memory cell. In FIG. 12, D1 is greater than D2. Therefore, the first memory cell 1210 of is generally less stable than the second memory cell 1220.

Figure 13:
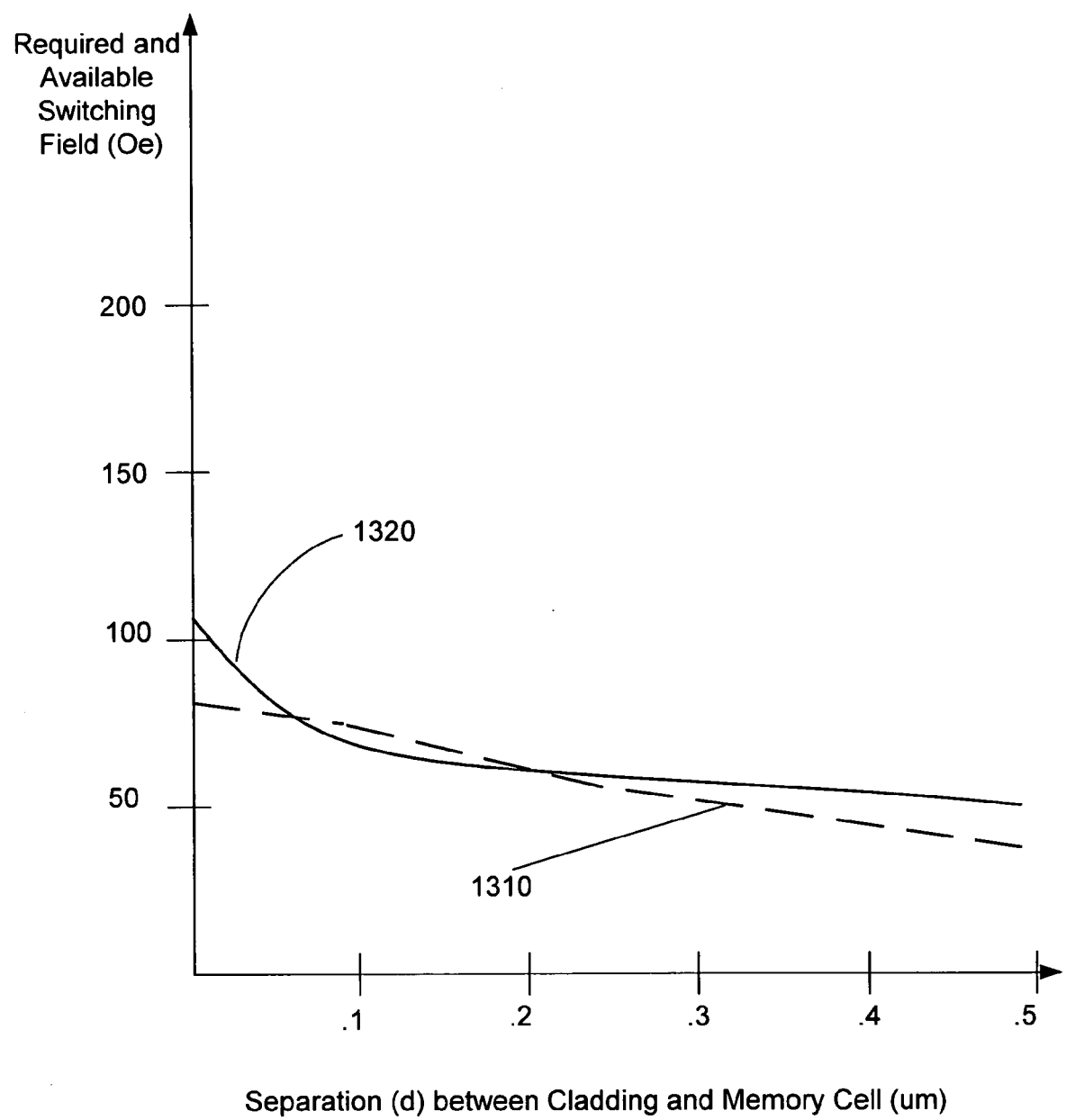
FIG. 13 is a plot showing the intensity of externally applied magnetic fields causing the MRAM memory cells located various distances from the conductive lines of FIG. 12 to change states.

FIG. 13 is a plot showing the relative intensity of externally applied magnetic fields causing the MRAM memory cells located various distances from the conductive lines of FIG. 12 to change states.

Again, the magnetic field intensity causing the magnetic memory cell to switch states in FIG. 12 can be determined by computer aided simulation, and the above described Landau-Lifschitz equation.

As the distance between the memory cell and a cladded write line decreases, the coupling between ferromagnetic cladding of the write line and data film of the memory cell increases. When the distance is zero (that is, the memory cell and the write line physically touch each other), the coupling between the memory cell and the write line is the greatest. The coupling is due to exchange interaction between the memory cell and the write line, and due to magnetostatic interaction between the memory cell and the write line. Exchange interaction is caused due to short-range spin interaction between the memory cell and the write line that holds the neighboring spins together. Magnetostatic interaction or demagnetization interaction is an interaction that exists between magnetic bodies.

The coupling between the memory cell and the conductive write line effectively increases the aspect ratio (length/width) of the memory cell. That is, the memory cell tends to be more stable due to the coupling. If the coupling is too strong, the memory cell can become so stable that switching the magnetic state of the memory cell is not possible due to constraints on the magnetic field intensity available for changing the state of the memory cell.

If the distance between the memory cell and the conductive write line is greater than zero, then the exchange interaction between the memory cell and the cladding of the write line is eliminated, and all that is left is the magnetostatic interaction.

As the distance between the memory cell and the cladding of the conductive write line increases, the coupling between the memory cell and the cladding decreases. Therefore, the memory cell becomes less stable.

A first curve 1310 depicts the magnetic field produced by the conductive line, and a second curve 1320 depicts the magnetic field causing the memory cell to change magnetic states. An optimal distance for this embodiment can be a separation distance of 50 nm to 200 nm. Within this separation distance, the magnetic write field produced by the conductive line is approximately equal to the magnetic write field to alter the state of the memory cell.

The memory cell shape, the amount of overlap and the distance between the memory cell and the write mechanism, can all be used to vary the practical trade off between memory cell stability and the ability to generate a magnetic write field.

Figure 14:
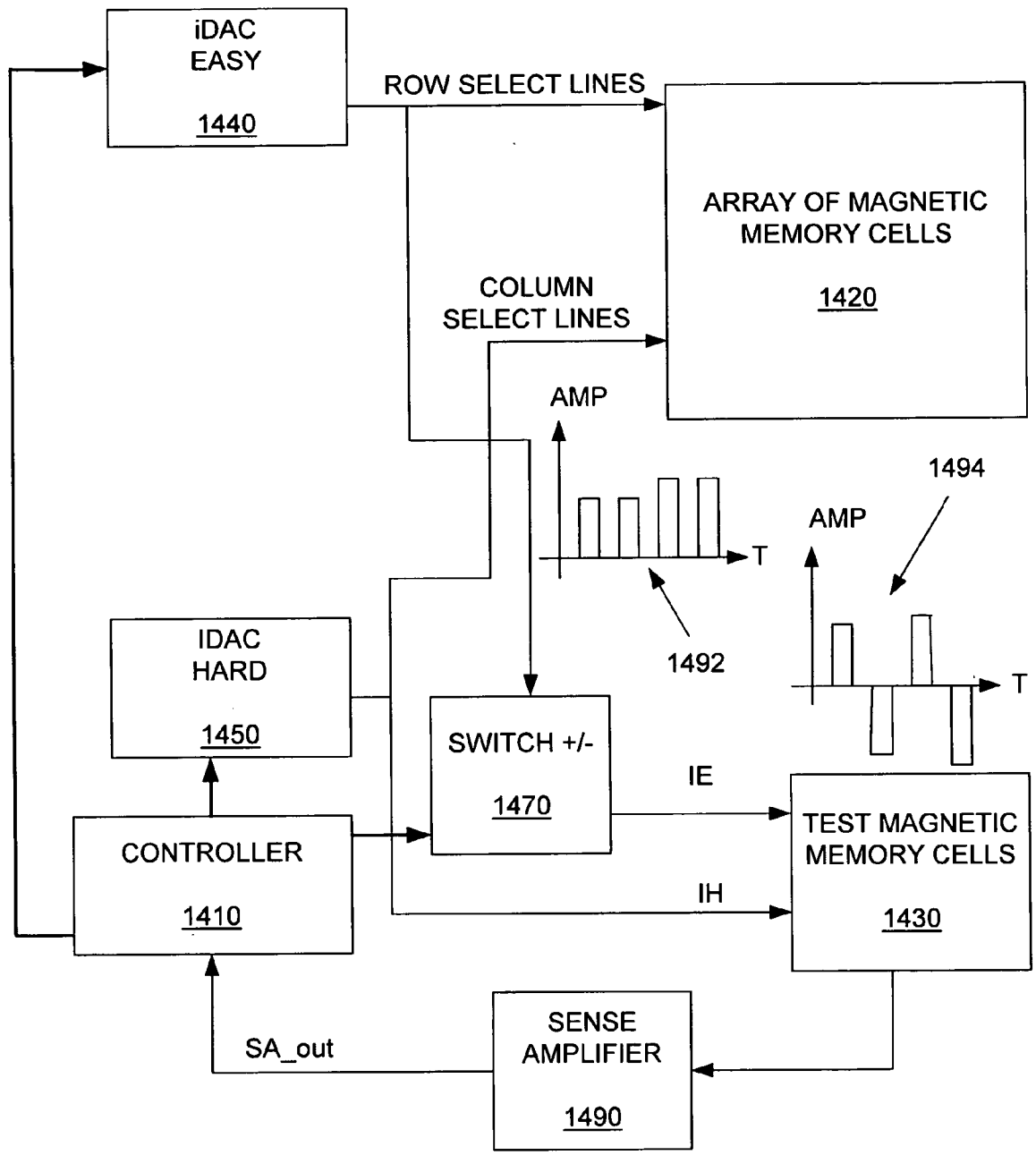
FIG. 14 shows memory array write mechanism that implements additional principles of the invention.

FIG. 14 shows an embodiment of a write current regulation circuit. The write current generator of this embodiment includes an easy axis current digital to analog converter (iDAC) 1440 and a hard axis iDAC 1450. The easy axis iDAC 1440 and the hard axis iDAC 1450 generate a series of pulsed write signals as shown in the plot 1492. The pulses are in the form of a current that can induce a magnetic field. The write signals are coupled to an array of magnetic memory cells 1420, and writes to selected memory cells within the array of magnetic memory cells 1420.

An easy axis switch 1470 receives the pulsed write signals (1492) of the easy axis iDAC 1440, and alternates that polarity of the pulses. That is, the easy axis switch 1470 generates a switch output that includes the pulsed write signal of the easy axis iDAC 1440 in which the polarity (positive and negative) of the pulsed signal (shown as 1494) alternates from one pulse to the next.

This embodiment does not include a hard axis switch. The uni-polarity pulsed write signals of the hard axis iDAC 1450 are coupled to the test magnetic memory cells 1430.

The alternating polarity pulses of the easy axis iDAC 1440 and the easy axis switch 1470, provide an alternating polarity pulsed magnetic field that is along the easy axis of the test magnetic memory cells 1430. The uni-polarity pulses of the hard axis iDAC 1450 provide a uni-polarity pulsed magnetic field that is along the hard axis of the test magnetic memory cells 1430.

The test magnetic memory cells 1430 provide a determination of whether the write current is greater than a maximum write current threshold or less than a minimum write current threshold. The responses of the test magnetic memory cell can be used to determine the optimal write current for the entire array 1420. That is, the response of the test magnetic memory cell can be used to determine the previously described optimal write current range in which the write current is great enough to provide reliable writing to a selected memory cell within the array of magnetic memory cells 1420, but small enough that half select errors within the array of magnetic memory cells are minimized.

A controller 1410 provides timing and amplitude control of the easy axis iDAC 1440 and the hard axis iDAC 1450. A sense amplifier 1490 senses the logical states of the test magnetic memory cells 1430. The sense amplifier 1490 is connected to the controller, so the controller can determine the logical state of the test magnetic memory cells 1430.

Figure 15:
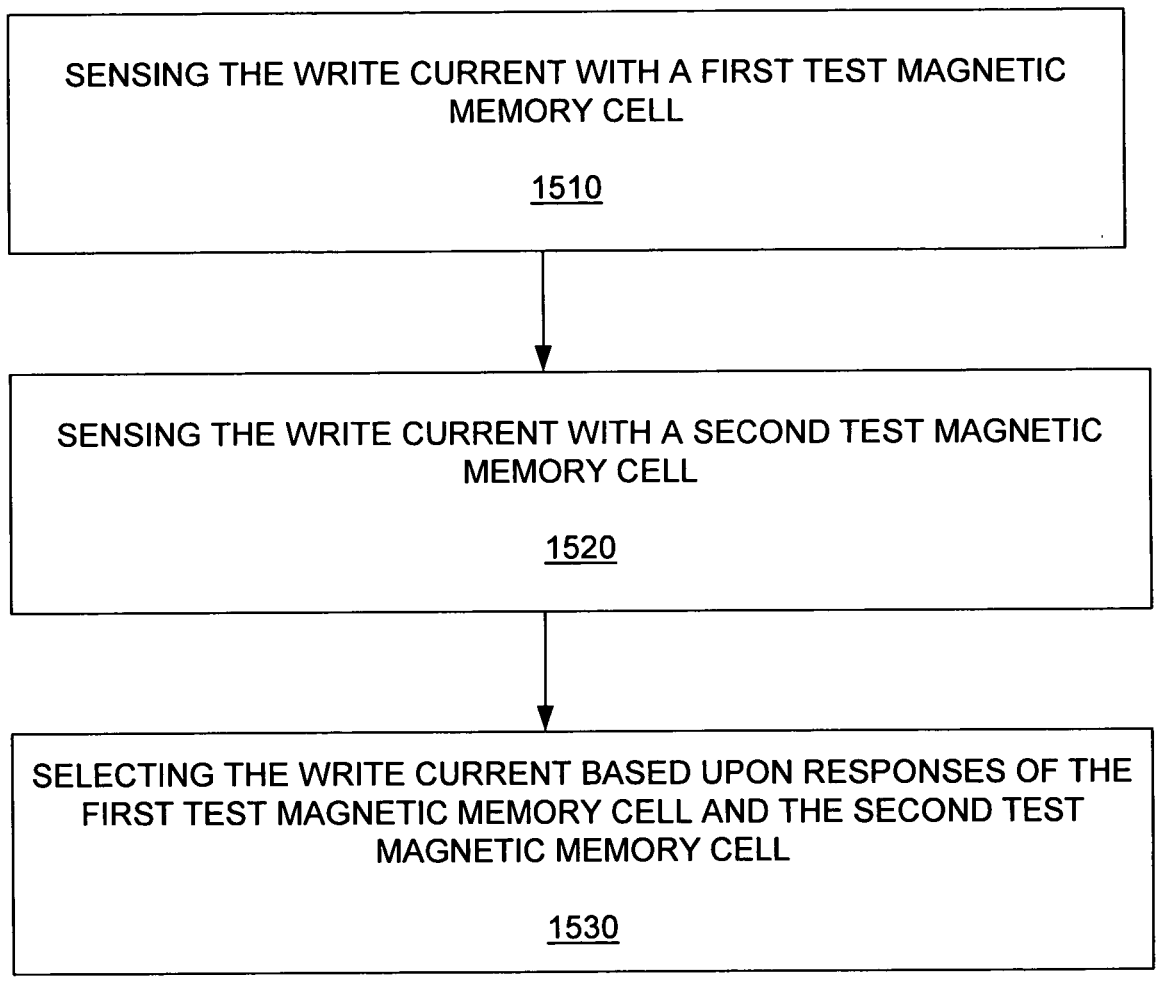
FIG. 15 shows a method for regulating a write current for a magnetic memory cell according to an embodiment of the invention.

FIG. 15 shows one example of a method of selecting a magnetic memory cell write current. A first step 1510 includes sensing the write current with a first test magnetic memory cell, a second step 1520 includes sensing the write current with a second test magnetic memory cell, and third step 1530 includes selecting the write current based upon responses of the first test magnetic memory cell and the second test magnetic memory cell.

Figure 16:
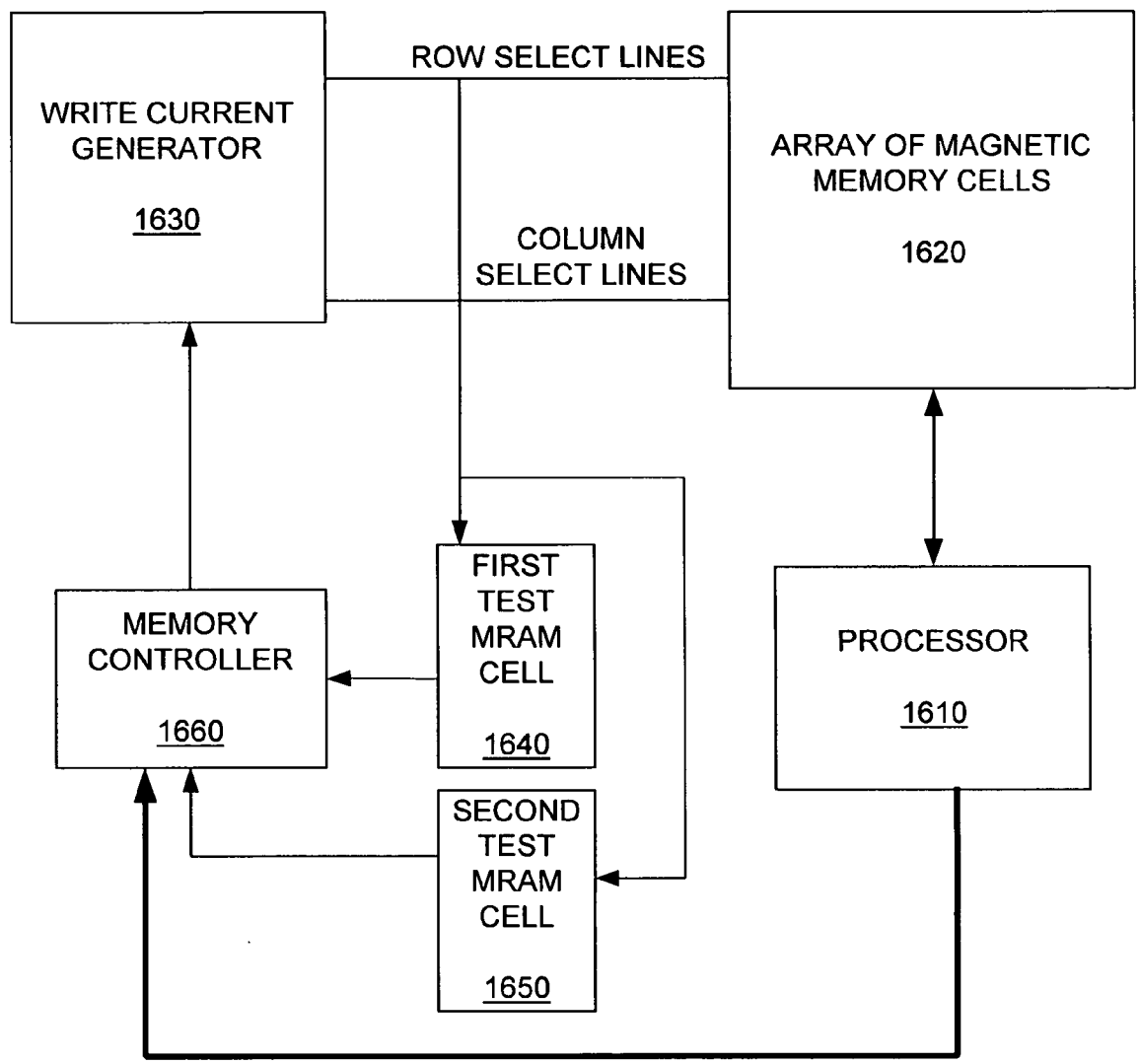
FIG. 16 shows a computing system that includes an MRAM array, according to an embodiment of the invention.

FIG. 16 shows one embodiment of a computing system that includes a processor 1610 interfaced with magnetic memory. The magnetic memory includes an array of magnetic memory cells 1620, and a write current generator 1630 for generating a write current for writing to selected memory cells within the array of magnetic memory cells 1620. A first test magnetic memory cell 1640 senses when a magnitude of the write current is large enough to reliably write to the magnetic memory cells. A second test magnetic memory cell 1650 senses when the magnitude of the write current is so large that half select errors occur when writing to the magnetic memory cells. A memory controller 1660 provides an interface between the processor 1610 and the magnetic memory cells 1620.

Although specific embodiments of the invention have been described and illustrated, the invention is not to be limited to the specific forms or arrangements of parts so described and illustrated. The invention is limited only by the appended claims.

What is claimed:

1. An array of magnetic memory cells comprising:
   a write current generator for generating a write current for writing to selected memory cells within the array of magnetic memory cells;
   a first test magnetic memory cell for sensing when a magnitude of the write current is large enough to reliably write to the magnetic memory cells;
   a second test magnetic memory cell for sensing when the magnitude of the write current is so large that half select errors occur when writing to the magnetic memory cells.

2. The array of magnetic memory cells of claim 1, wherein the first test magnetic memory cell and the second test magnetic memory cell are substantially larger than the memory cells of the array of magnetic memory cells.

3. The array of magnetic memory cells of claim 1, wherein if the first test magnetic memory cell does not change magnetic orientations when sensing the write current, the write current is increased.

4. The array of magnetic memory cells of claim 1, wherein if the second test magnetic memory cell does change magnetic orientations when sensing the write current, the write current is decreased.

5. A method of selecting a magnetic memory cell write current comprising:
   sensing the write current with a first test magnetic memory cell;
   sensing the write current with a second test magnetic memory cell;
   selecting the write current based upon the sensing of the first test magnetic memory cell and the second test magnetic memory cell.

6. The method of claim 5, wherein the first test magnetic memory cell changes magnetic orientation when the write current exceeds a first threshold.

7. The method of claim 5, wherein the second test magnetic memory cell changes magnetic orientation when the write current exceeds a second threshold.

8. The method of claim 5, wherein if the first test magnetic memory cell does not change magnetic orientations, then the write current is increased.

9. The method of claim 5, wherein if the second test magnetic memory cell changes magnetic orientations, then the write current is decreased.

10. A magnetic memory apparatus comprising:
    an array of magnetic memory cells;
    a write current generator for generating write current for writing to the magnetic memory cells;
    means for sensing the write current with a first test magnetic memory cell;
    means for sensing the write current with a second test magnetic memory cell;
    means for selecting the write current based upon responses of the first test magnetic memory cell and the second test magnetic memory cell.

11. A computing system comprising:
    a processor interfaced with an array of magnetic memory cells;
    the array of magnetic memory cells comprising;
       a write current generator for generating a write current for writing to selected memory cells within the array of magnetic memory cells;
       a first test magnetic memory cell for sensing when a magnitude of the write current is large enough to reliably write to the magnetic memory cells;
       a second test magnetic memory cell for sensing when the magnitude of the write current is so large that half select errors occur when writing to de memory cells.

* * * * *